US012676431B2

(12) United States Patent
Abe et al.

(10) Patent No.: US 12,676,431 B2
(45) Date of Patent: Jul. 7, 2026

(54) TERMINAL BLOCK

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Tomoki Abe, Yokkaichi (JP); Daisuke Hashimoto, Yokkaichi (JP); Masaharu Suetani, Yokkaichi (JP); Kentaro Tachi, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 192 days.

(21) Appl. No.: 18/700,043

(22) PCT Filed: Sep. 29, 2022

(86) PCT No.: PCT/JP2022/036389
§ 371 (c)(1),
(2) Date: Apr. 10, 2024

(87) PCT Pub. No.: WO2023/068006
PCT Pub. Date: Apr. 27, 2023

(65) Prior Publication Data
US 2025/0246825 A1 Jul. 31, 2025

(30) Foreign Application Priority Data

Oct. 20, 2021 (JP) ................................. 2021-171746

(51) Int. Cl.
| | | |
|---|---|---|
| *H01R 9/00* | (2006.01) | |
| *H01R 9/24* | (2006.01) | |
| *H05K 7/20* | (2006.01) | |

(52) U.S. Cl.
CPC ....... *H01R 9/2425* (2013.01); *H05K 7/20863* (2013.01); *H05K 7/20872* (2013.01); *H01R 2201/10* (2013.01)

(58) Field of Classification Search
CPC .............. H01R 9/2425; H01R 2201/10; H05K 7/20863; H05K 7/20872
See application file for complete search history.

(56) References Cited

U.S. PATENT DOCUMENTS

| | | | |
|---|---|---|---|
| 2012/0186872 A1 | 7/2012 | Akuta | |
| 2012/0223601 A1* | 9/2012 | Akuta | .................... H02K 5/225 |
| | | | 310/58 |

FOREIGN PATENT DOCUMENTS

| | | |
|---|---|---|
| JP | 2011-187838 A | 9/2011 |
| JP | 2017-118672 A | 6/2017 |

(Continued)

OTHER PUBLICATIONS

Nov. 8, 2022 International Search Report issued in International Patent Application No. PCT/JP2022/036389.

*Primary Examiner* — Pete T Lee
(74) *Attorney, Agent, or Firm* — Oliff PLC

(57) ABSTRACT

A terminal block that is to be fixed to a case of a device and to which an electrically conductive member is to be fastened by a bolt, the terminal block including: a nut to which the bolt is to be screwed; a heat sink that includes a heat dissipation portion configured to come into contact with a coolant for cooling the device; and an insulator that electrically insulates the nut and the heat sink from each other, wherein the heat sink includes a rib located around the nut.

9 Claims, 6 Drawing Sheets

(56)         References Cited

FOREIGN PATENT DOCUMENTS

| JP | 2020-114071 A | 7/2020 |
| JP | 2021-064580 A | 4/2021 |

* cited by examiner

TERMINAL BLOCK

BACKGROUND

The present disclosure relates to a terminal block.

JP 2021-64580A, JP 2020-114071A and JP 2012-186882A disclose techniques related to a terminal block. For example, JP 2012-186882A discloses a terminal block that is fixed to a motor case and in which bus bars are fastened by tightening bolts. The terminal block includes nuts for tightening the bolts and an aluminum die-cast heat sink that is in areal contact therewith behind the nuts with an insulation plate in between, and also includes a heat dissipation portion that comes into contact with cooling water passing through a coolant flow path in the motor case.

SUMMARY

It is conceivable that energy density will increase as units to which such a terminal block is applied are downsized and have higher power output. For this reason, there is demand for further improvement in heat dissipation of the terminal block.

An exemplary aspect of the disclosure improves heat dissipation of a terminal block.

A terminal block of the present disclosure is a terminal block that is to be fixed to a case of a device and to which an electrically conductive member is to be fastened by a bolt, the terminal block including: a nut to which the bolt is to be screwed; a heat sink that includes a heat dissipation portion configured to come into contact with a coolant for cooling the device; and an insulator that electrically insulates the nut and the heat sink from each other, wherein the heat sink includes a rib located around the nut.

According to the present disclosure, it is possible to improve heat dissipation of a terminal block.

Figure 1:
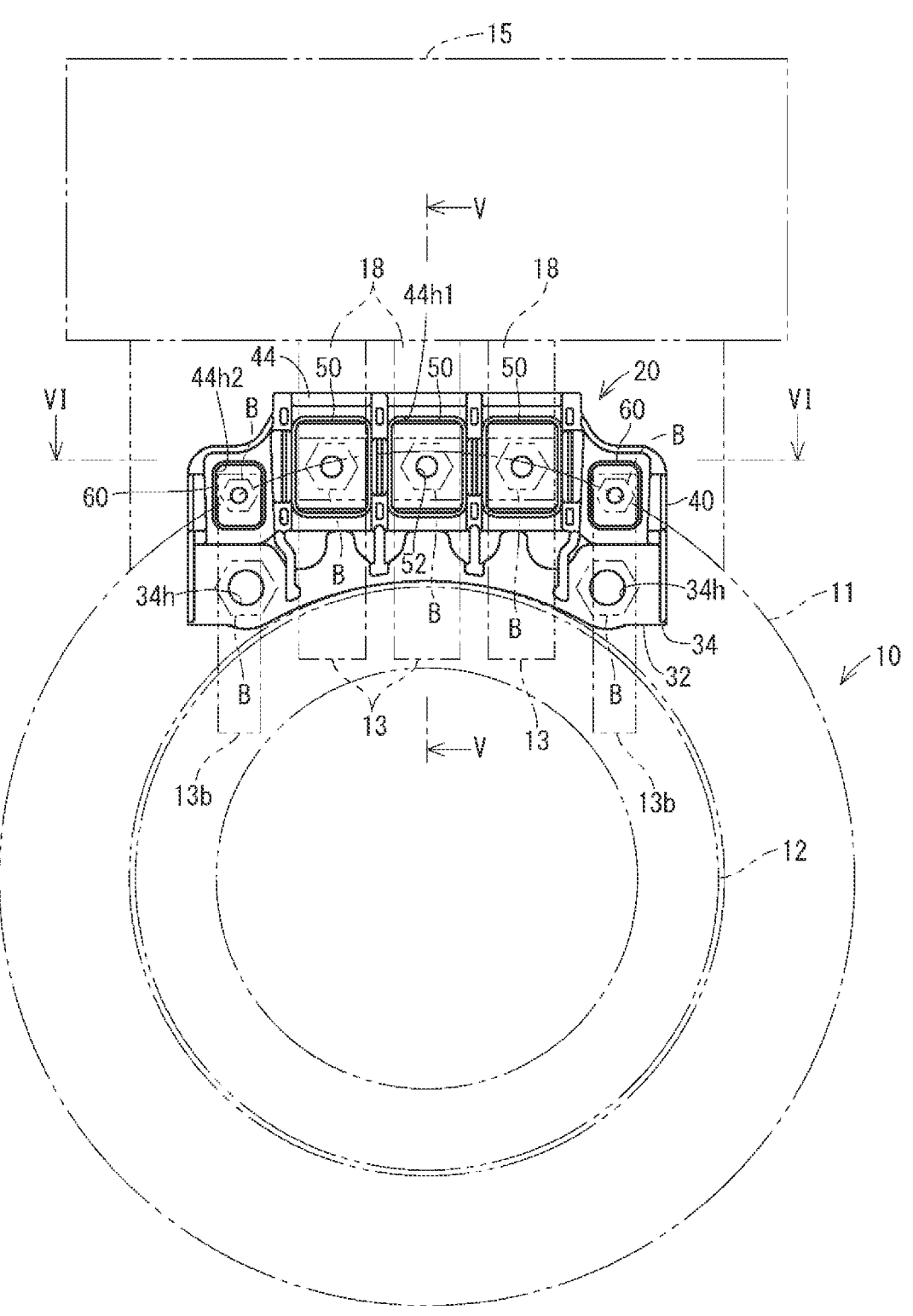
FIG. 1 is a schematic front view of an application example of a terminal block according to a first embodiment.

DETAILED DESCRIPTION OF EMBODIMENTS
DESCRIPTION OF EMBODIMENTS OF PRESENT DISCLOSURE

First, embodiments of the present disclosure will be listed and described.

A terminal block of the present disclosure is as described below.

(1) A terminal block is a terminal block that is to be fixed to a case of a device and to which an electrically conductive member is to be fastened by a bolt, and includes a nut portion to which the bolt is to be screwed, a heat sink that includes a heat dissipation portion configured to come into contact with a coolant for cooling the device, and an insulating member that electrically insulates the nut portion and the heat sink from each other, and the heat sink includes a rib located around the nut portion.

According to the terminal block, the heat generated in the electrically conductive member can be easily transferred from the bolt through the rib to the heat sink. This improves the heat dissipation of the terminal block.

(2) In the terminal block according to (1), the nut portion may be shaped so as to be surrounded by a plurality of sides as viewed along an axial direction of the bolt, and the rib may be provided at positions corresponding to all of the plurality of sides. In this case, since the rib is provided at the positions corresponding to all of the plurality of sides, the heat of the nut portion can be effectively transferred to the heat sink.

(3) In the terminal block according to (1), the nut portion may be shaped so as to be surrounded by a plurality of sides as viewed along an axial direction of the bolt, a plurality of the nut portions may be provided, the plurality of nut portions may be provided in parallel and spaced apart from each other to form a nut group, and the rib may be provided at positions corresponding to all sides located on an outer periphery of the nut group, among the pluralities of sides of the plurality of nut portions. In this case, since the rib is provided at the positions corresponding to all of the sides located on the outer periphery of the nut group among the pluralities of sides of the plurality of nut portions, the heat of the nut portions can be effectively transferred to the heat sink.

(4) In the terminal block according to (3), the rib may be provided at a position between the plurality of nut portions. In this case, the heat of the nut portions can be effectively transferred to the heat sink by the rib located between the plurality of nut portions.

(5) In the terminal block according to any one of (2) to (4), the rib may be formed so as to extend along the sides of the nut portion. In this case, the rib can be located as close to the nut portion as possible while keeping a preferable insulating distance with respect to the nut portion, for example. Accordingly, the heat of the nut portion can be effectively transferred to the heat sink.

(6) In the terminal block according to any one of (2) to (5), the nut portion may include a plurality of outward-facing side surfaces corresponding to the plurality of sides, and the rib may be provided so as to oppose at least one of the plurality of outward-facing side surfaces with an interval therebetween. In this case, since the rib is provided so as to oppose at least one of the plurality of outward-facing side surfaces with an interval therebetween, the heat of the nut portion can be effectively transferred to the heat sink.

(7) In the terminal block according to any one of (2) to (6), the rib may include a first adjacent rib and a second adjacent rib that are provided in correspondence with adjacent sides at an angle among the plurality of sides, and a space may be formed between the first adjacent rib and the second adjacent rib.

For example, in the case of providing the first adjacent rib and the second adjacent rib in correspondence with sides adjacent to each other at an angle, if the first adjacent rib and the second adjacent rib are contiguous with each other, it may be difficult to perform precision processing at the corner in the boundary between the first adjacent rib and the second adjacent rib. In this case, due to the restriction on the corner processing, the first adjacent rib and the second adjacent rib may be provided at positions separated from each other with respect to the nut portion in order to ensure insulation. With a space formed between the first adjacent rib and the second adjacent rib, there is no restriction on the corner processing, and the first adjacent rib and the second adjacent rib can be easily arranged at positions close to each other with respect to the nut portion. Accordingly, the terminal block can be downsized as compared with the case where the first adjacent rib and the second adjacent rib are formed contiguously with each other.

(8) In the terminal block according to any one of (1) to (7), a protrusion height of the rib may be less than or equal to a surface height of the nut portion. This makes the electrically conductive member less likely to interfere with the rib.

(9) In the terminal block according to any one of (1) to (8), the insulating member may include a first insulating portion interposed between the nut portion and the heat sink and a second insulating portion surrounding a periphery of the nut portion, and the rib may be embedded in the second insulating portion. Accordingly, it is possible to insulate the nut portion and the heat sink from each other by the insulating member and hold the nut portion at a definite position and in a definite orientation. Since the rib is embedded in the second insulating portion, the heat of the nut portion can be easily transferred through the rib to the heat sink.

DETAILS OF EMBODIMENTS OF PRESENT DISCLOSURE

Specific examples of the terminal block of the present disclosure will be described below with reference to the drawings. It should be noted that the present disclosure is not limited to the examples herein, but rather is indicated by the scope of claims, and is intended to include all modifications within the meaning and scope equivalent to the scope of claims.

EMBODIMENTS

Hereinafter, a terminal block according to an embodiment will be described.

Application Example of Terminal Block

An application example of the terminal block will be described. FIG. 1 is a schematic front view of an application example of a terminal block 20. The terminal block 20 is fixed to a case 11 of a first device 10. Electrically conductive members 13 and 18 are fastened and fixed to the terminal block 20 by bolts B. Accordingly, the electrically conductive members 13 and the electrically conductive members 18 are electrically and mechanically connected to each other. The electrically conductive members 13 can be considered to be members extending from the first device 10. The electrically conductive members 18 can be considered to be members extending from a second device 15. Therefore, the terminal block 20 can be used as a portion for electrically connecting the first device 10 and the second device 15.

The first device 10 is a mechanical device that has a movable part, for example. The first device 10 is a rotary electric machine including the case 11, an armature 12, and a field magnet, for example. FIG. 1 illustrates an example in which the armature 12 serving as a stator is fixed to the cylindrical case 11. The field magnet is arranged as a rotor in the armature 12. The field magnet is rotated by a magnetic field generated by the armature 12, or the armature 12 generates electromotive force by the rotation of the field magnet. The first device 10 includes a coolant 14 for cooling the first device 10. The coolant 14 is a liquid that flows through a coolant flow path 1 if (see FIG. 5) formed between the inner peripheral surface and outer peripheral surface of the case 11, for example. The liquid flowing through the coolant flow path 11f is water, for example. The coolant may also be sealed in the case 11. In this case, the liquid may also be lubricant oil, for example.

The second device 15 is an electric device having a signal processing circuit. For example, the second device 15 is an electric device having a control circuit that controls the first device 10. More specifically, the second device 15 is an inverter device that controls driving of the first device 10 that is a rotary electric machine. The second device 15 may be integrated into the case 11 of the first device 10 by bolt fixing or the like. In this manner, the unit formed by integrating the first device 10 that is a mechanical device and the second device that has a control circuit to control the first device may be called a mechanical and electrical integrated unit.

The electrically conductive members 13 of the first device 10 are assumed to be bus bars connected to a coil wire of the armature 12. The electrically conductive members 18 of the second device 15 are assumed to be bus bars connected to output terminals of an inverter circuit of the second device 15. The bus bar is an elongated plate-like member that is formed from a metallic plate material of copper, copper alloy, or the like, and has a hole for tightening and fixing the bolt B. In the present embodiment, the first device 10 is assumed to be a rotary electric machine that is usable as a three-phase alternating-current motor. Therefore, three electrically conductive members 13 extend from the armature 12 toward the case 11 in parallel with an interval therebetween. In addition, three electrically conductive members 18 extend from the second device 15 in parallel with the same interval as that of the three electrically conductive members 13. The terminal block 20 is fixed to the end surface of an opening side of the case 11. The terminal block 20 is fixed to the case 11 by tightening the bolts B, for example. On the terminal block 20, the end portions of the three electrically conductive members 13 are laid on the end portions of the corresponding three electrically conductive members 18. In this state, the bolts B are passed through the electrically conductive members 13 and 18 and are screwed and tightened to nut portions 50 (nuts) of the terminal block 20. Accordingly, the electrically conductive members 13 and 18 in the state of being in contact with each other are fixed onto the terminal block 20 at definite positions, and the electrically conductive members 13 and 18 are electrically connected. The opening of the case 11 is closed by a lid portion.

The number of the electrically conductive members 13 and 18 connected by the terminal block 20 can be set to any number. One of the electrically conductive members to be connected may be integrally supported by the terminal block 20 in the state before the fastening and fixing by the bolt B.

Overall Configuration of Terminal Block

Figure 2:
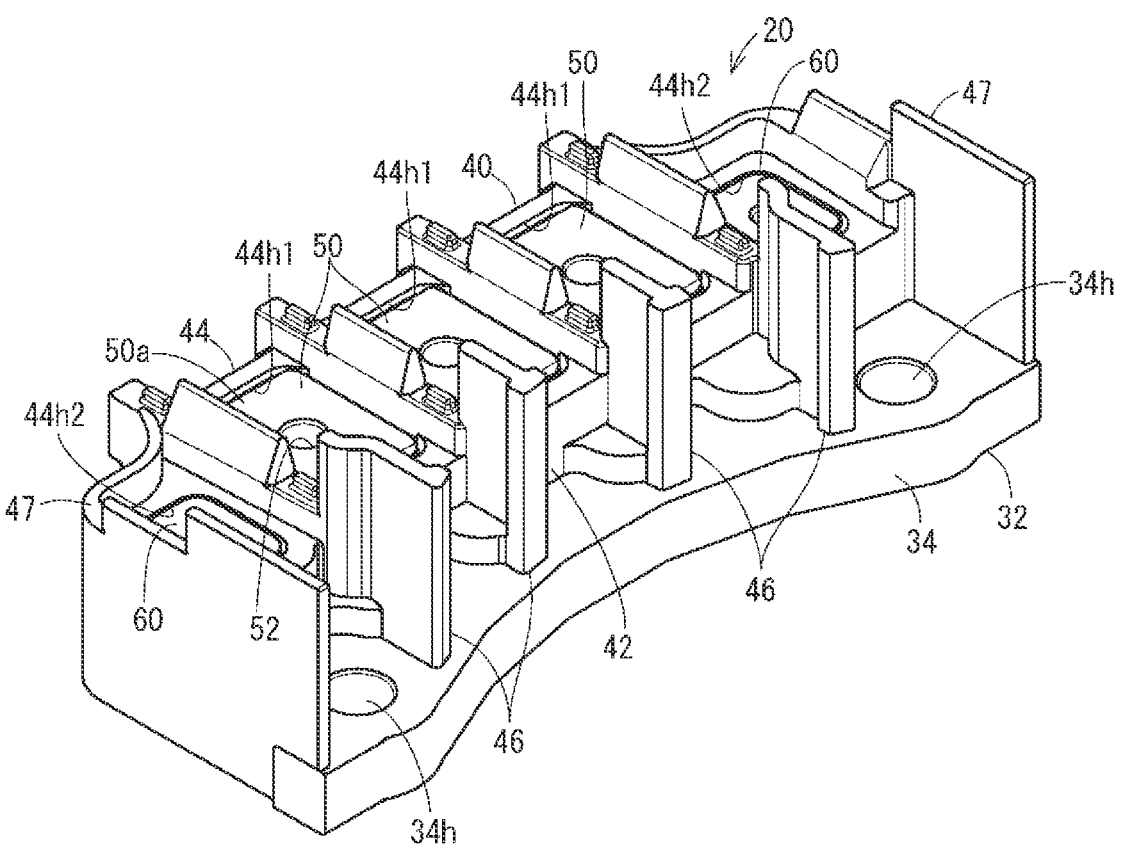
FIG. 2 is a perspective view of the terminal block.
Figure 3:
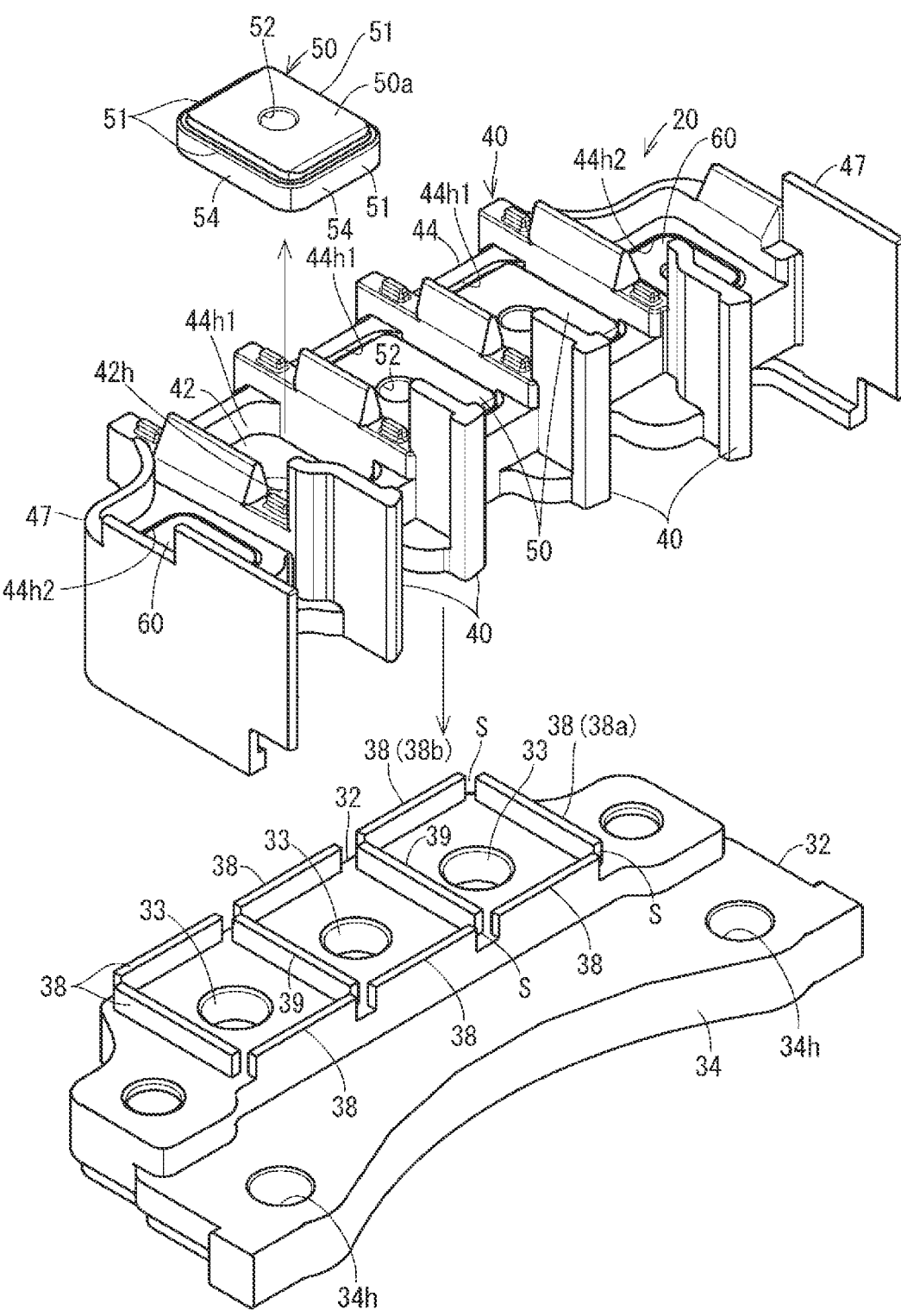
FIG. 3 is an exploded perspective view of the terminal block.
Figure 4:
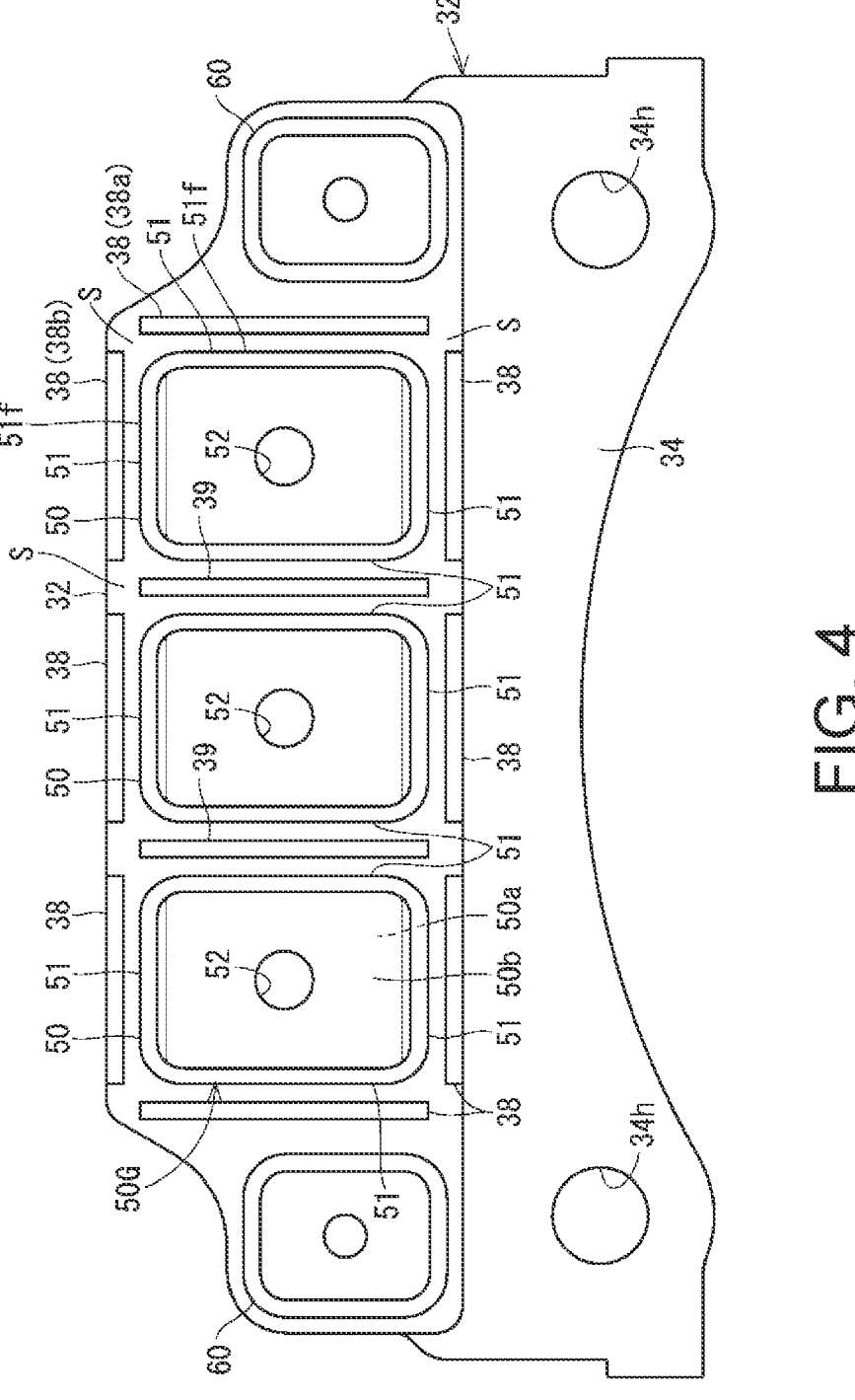
FIG. 4 is a front view of a heat sink.
Figure 5:
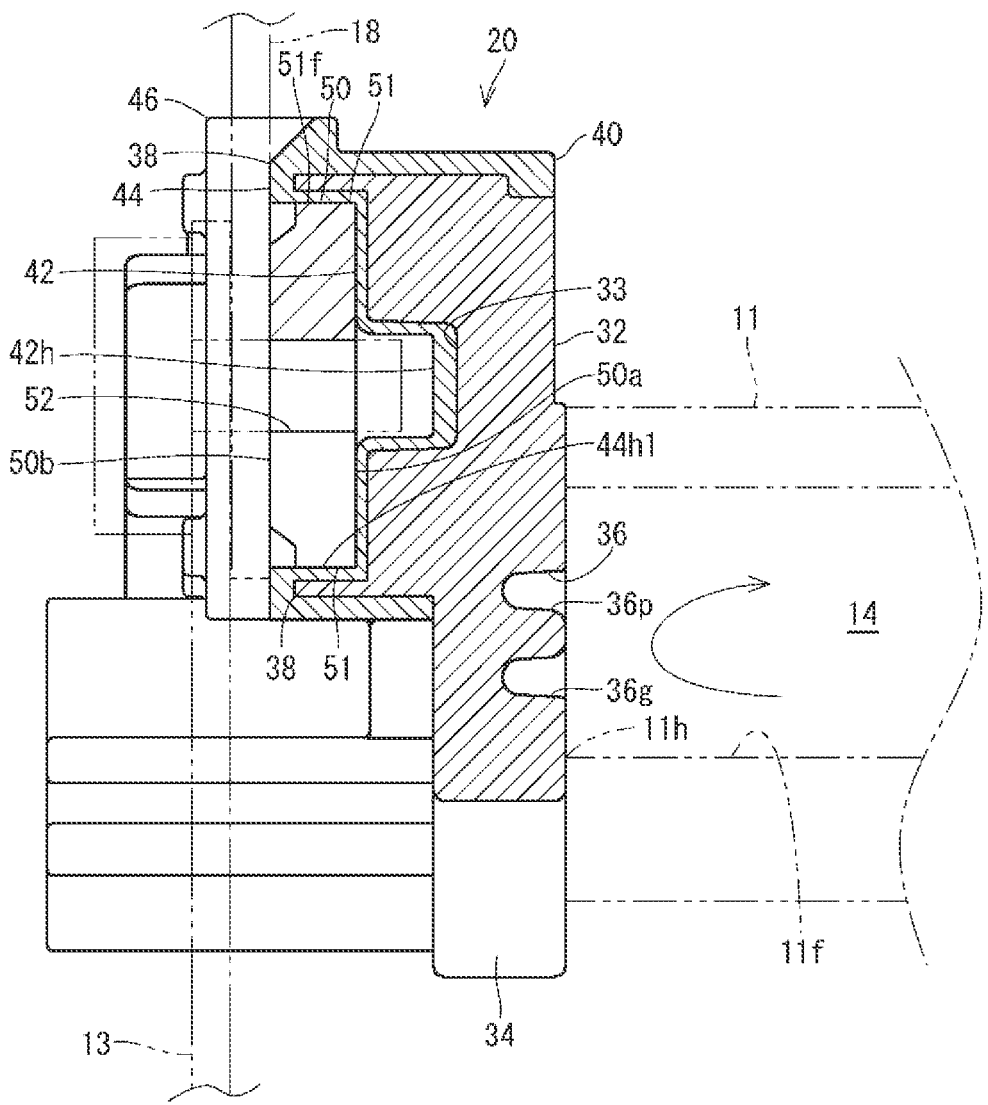
FIG. 5 is a cross-sectional view taken along line V-V in FIG. 1.
Figure 6:
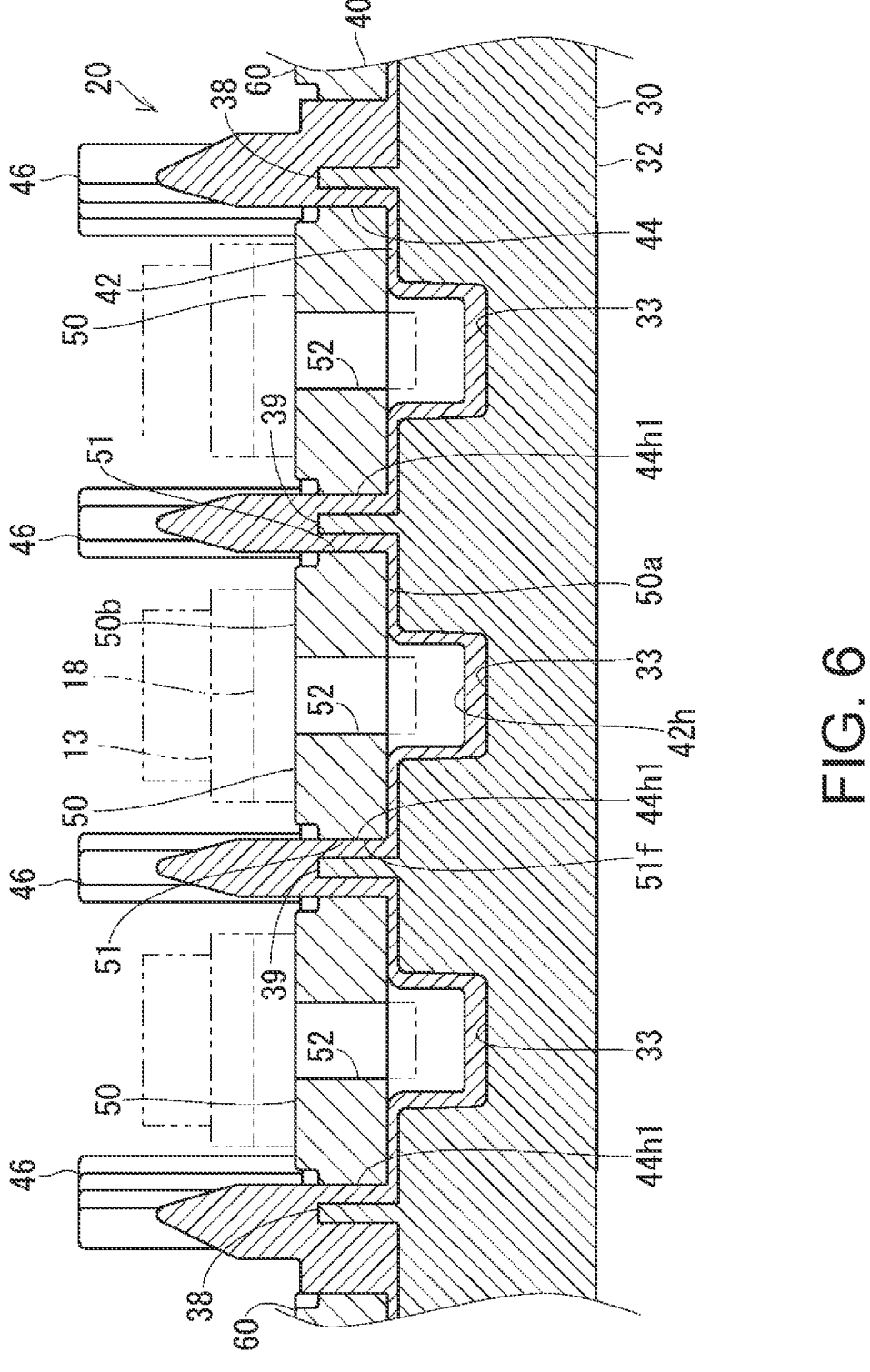
FIG. 6 is a cross-sectional view taken along line VI-VI in FIG. 1.

An overall configuration of the terminal block 20 will be described. FIG. 2 is a perspective view of the terminal block 20. FIG. 3 is an exploded perspective view of the terminal block 20. FIG. 3 illustrates a state in which a heat sink 30 is separated from the insulating member 40 (insulator) and one of the plurality of nut portions 50 is separated from the insulating member 40. FIG. 4 is a front view of the heat sink 30. FIG. 4 illustrates the nut portions 50 in order to describe the positions of ribs 38 and 39 in relation to the nut portions 50. FIG. 5 is a cross-sectional view taken along line V-V in FIG. 1. FIG. 6 is a cross-sectional view taken along line VI-VI in FIG. 1.

The terminal block 20 includes the nut portions 50, the heat sink 30, and the insulating member 40.

Each nut portion 50 is a nut to which the bolt B is screwed. The nut portion 50 is a member with a screw hole 52, for example. The nut portion 50 preferably has a non-circular outer peripheral shape such that the nut portion 50 can be held by the insulating member 40 in a non-rotatable state. For example, the nut portion 50 is shaped so as to be surrounded by a plurality of sides 51 as viewed along the axial direction of the bolt B (that is, the axial direction of the screw hole 52). The plurality of sides 51 are linear, for example. The sides 51 adjacent to each other in the peripheral direction of the nut portion 50 may be connected in a curve. In the present embodiment, the nut portion 50 is formed in a square shape as viewed along the axial direction of the bolt B, more specifically, in a rectangular shape in which a pair of opposing sides are longer than the other pair of opposing sides. The nut portions 50 may be formed in another polygonal shape, for example, a hexagonal shape.

A pair of main surfaces 50a and 50b of the nut portion 50 on both sides in the thickness direction are surfaces that face directions opposite to each other and are parallel to each other. The one main surface 50a can be in surface contact with the bottom surface of a nut storage recess 44h1 of the insulating member 40. The other main surface 50b can be in surface contact with the electrically conductive member 13 or the electrically conductive member 18.

In the present embodiment, the terminal block 20 includes three nut portions 50 in accordance with the number of connections of the electrically conductive members 13 and 18. The number of the nut portions 50 can be set to any number in accordance with the number of connections of the electrically conductive members 13 and 18 to be fastened. The terminal block 20 may include other nut portions 60.

The heat sink 30 is made of a thermally conductive material. The thermally conductive material is a material with a more favorable thermal conductivity than the insulating member 40. For example, the thermal conductive material is a metal such as aluminum or aluminum alloy. The heat sink 30 is a portion integrally formed by metal cutting, for example. The heat sink 30 may be formed by molding, pressing, or the like. The heat sink 30 includes a nut support base portion 32 and a fixing base portion 34.

The nut support base portion 32 is formed in an elongated plate-like shape. The nut portions 50 and the nut portions 60 are supported on the one main surface of the nut support base portion 32 with the insulating member 40 in between. In the present embodiment, the three nut portions 50 are located at the center of the nut support base portion 32 in the longitudinal direction, and the two nut portions 60 are located at both end portions of the nut support base portion 32 in the longitudinal direction. Bolt escape holes 33 are formed on one main surface of the nut support base portion 32. The bolt escape holes 33 are bottomed holes and are located on extensions of the screw holes of the nut portions 50 and nut portions 60.

The fixing base portion 34 is an elongated plate-like portion that extends from one side of the nut support base portion 32 in the short-side direction toward the outside of the nut support base portion 32. In the present embodiment, the fixing base portion 34 is thinner than the nut support base portion 32, and there is a step between the fixing base portion 34 and the nut support base portion 32. The fixing base portion 34 has fixing holes 34h. In the present embodiment, the fixing holes 34h are formed at ends of the fixing base portion 34 in the longitudinal direction. In a state where the bolts B are inserted into the fixing holes 34h and screwed and tightened into the screw holes in the case 11, the terminal block 20 is fixed to the case 11. The extension position of the fixing base portion 34 relative to the nut support base portion 32 can be set to any position. For example, a fixing base portion having fixing holes may extend on outward extensions of the ends of the nut support base portion 32 in the longitudinal direction.

The heat sink 30 has a heat dissipation portion 36 that comes into contact with a coolant 14 for cooling the first device 10. The heat dissipation portion 36 is formed so as to face the case 11 in a state where the terminal block 20 is fixed to the case 11. For example, the coolant flow path 1 if in the case 11 is open at a portion of the opening end surface of the case 11 to which the terminal block 20 is to be attached. The heat sink 30 is fixed to the case 11 so as to block an opening 11h. The heat dissipation portion 36 is formed at a portion of the case 11 that blocks the opening 11h. In the present embodiment, the heat dissipation portion 36 is formed on the other main surface of the heat sink 30 that faces the direction opposite to the nut portions 50. In the present embodiment, the other main surface of the heat sink 30 has an arc-shaped groove 36g along the opening end surface of the case 11. The heat dissipation portion 36 includes the surface of the groove 36g. When the coolant 14 enters the groove 36g, the flow of the coolant 14 can come close to the nut portions 50, and the area of contact between the coolant 14 and the heat sink 30 increases. Accordingly, the heat of the heat sink 30 can be effectively transferred to the coolant 14. In the present embodiment, an arc-shaped convex portion 36p is formed on the bottom of the groove 36g. The heat dissipation portion 36 includes the surface of the arc-shaped convex portion 36p. The arc-shaped convex portion 36p further increases the area of contact between the coolant 14 and the heat sink 30, and the heat of the heat sink 30 can be more effectively transferred to the coolant 14.

It is not essential that the heat dissipation portion 36 is configured as described above. For example, the heat dissipation portion may also be a through hole that passes through the heat sink 30 and through which the coolant flows. Any portion of the heat sink 30 that comes into contact with the coolant 14 can be set as the heat dissipation portion. The heat dissipation portion 36 may be a portion that is cooled by oil sealed in the case 11.

The heat sink 30 includes ribs 38 and 39 that are located around the nut portions 50. The ribs 38 and 39 protrude from the one main surface of the nut support base portion 32 so as to be located around the nut portions 50. Specific configuration examples of the ribs 38 and 39 will be described later in detail.

The insulating member 40 is a member that electrically insulates the nut portions 50 and the heat sink 30 from each other. The insulating member 40 is a member that is formed from a resin by integral molding, for example. The insulating member 40 is a member that is molded with the heat sink 30 as an insert, for example.

The insulating member 40 includes a first insulating portion 42, a second insulating portion 44, and partition portions 46 and 47. The first insulating portion 42 is a portion that is interposed between the nut portions 50 and the heat sink 30. The second insulating portion 44 is a portion that surrounds the peripheries of the nut portions 50. The second insulating portion 44 further has a portion that surrounds the nut portions 60. The partition portions 46 are portions that divide the nut portions 50 or the electrically conductive members 13 and 18 connected to the nut portions 50 from other portions. The partition portions 47 are portions that partition the nut portions 60 and electrically conductive members 13b connected to the nut portions 60 from other portions.

More specifically, the first insulating portion 42 is formed in an elongated plate-like shape that extends on the entire one main surface of the nut support base portion 32. Since the nut portions 50 and 60 are arranged on the first insulating portion 42, the nut portions 50 and 60 are kept in the state of being electrically insulated from the heat sink 30 by the first insulating portion 42. The first insulating portion 42 may partially or entirely cover the outer periphery of the nut support base portion 32. In the present embodiment, the fixing base portion 34 is mostly exposed from the insulating member 40.

The first insulating portion 42 has bolt escape holes 42h on the surface on which the nut portions 50 and 60 are arranged. The bolt escape holes 42h are bottomed holes formed at positions corresponding to the bolt escape holes 33 described above, and are located on extensions of the screw holes of the nut portions 50 and nut portions 60.

The second insulating portion 44 protrudes from the surface of the first insulating portion 42 on which the nut portions 50 and 60 are arranged so as to surround the periphery of the nut portions 50 and 60. That is, the insulating member 40 has nut storage recesses 44h1 that can store the nut portions 50 at definite positions in a state of being restricted in rotation. The portion constituting the bottoms of the nut storage recesses 44h1 is the first insulating portion 42, and the portion constituting the peripheral walls of the nut storage recesses 44h1 is the second insulating portion 44. In the present embodiment, the insulating member 40 also has nut storage recesses 44h2 that can store the nut portions 60 at definite positions in a state of being restricted in rotation. The portion constituting the bottoms of the nut storage recesses 44h2 is the first insulating portion 42, and the portion constituting the peripheral walls of the nut storage recesses 44h2 is the second insulating portion 44.

In the present embodiment, in correspondence with the three nut portions 50, the three nut storage recesses 44h1 are formed in the insulating member 40 so as to be arranged side by side in a line with an interval therebetween. In the direction in which the three nut storage recesses 44h1 are aligned, the two nut storage recesses 44h2 are formed outside of the three nut storage recesses 44h1. Accordingly, when the three nut portions 50 are stored in the three nut storage recesses 44h1, the three nut portions 50 are held so as to be arranged side by side in a line with an interval therebetween in a state in which rotation is restricted. In addition, in the direction in which the three nut portions 50 are arranged side by side, the two nut portions 60 are held outward of the three nut portions 50 in a state in which rotation is restricted. Since the nut portions 50 and 60 are separately stored in the nut storage recesses 44h1 and 44h2, the nut portions 50 and 60 are kept in a state of being electrically insulated from each other by the insulating member 40.

The nut storage recesses 44h1 and 44h2 may be formed by molding the insulating member 40 with the nut portions 50 and 60 as inserts. Alternatively, the insulating member 40 including the nut storage recesses 44h1 and 44h2 may be molded separately from the nut portions 50 and 60, and the nut portions 50 and 60 may be fitted into the nut storage recesses 44h1 and 44h2.

The number and positions of the nut portions 50 and 60 and nut storage recesses 44h1 and 44h2 can be changed as appropriate according to the number, arrangement, and the like of the electrically conductive members 13, 13b, and 18 that are connection targets.

Each partition portion 46 is a portion that extends from the first insulating portion 42 and the second insulating portion 44 in a direction intersecting the direction in which the plurality of nut portions 50 are aligned. More specifically, the partition portions 46 are located between the plurality of nut storage recesses 44h1 and between the nut storage recess 44h1 and the nut storage recess 44h2. Each partition portion 46 includes an elongated plate-like portion that extends to the side opposite to the first insulating portion 42 beyond the second insulating portion 44 and a plate-like portion that extends from the first insulating portion 42 and the second insulating portion 44 toward the fixing base portion 34. The partition portions 46 suppress contact among the electrically conductive members 13, 13b, and 18 in relation to the adjacent nut portions 50 and 60.

Each partition portion 47 is a portion that extends from the first insulating portion 42 and the second insulating portion 44 in a direction intersecting the direction in which the plurality of nut portions 50 and 60 are arranged side by side. More specifically, the partition portions 47 are located outward of the partition portions 46 at ends in the direction in which the plurality of nut storage recesses 44h1 and 44h2 are arranged side by side. Each partition portion 47 includes a plate-like bent portion that extends to the side opposite to the first insulating portion 42 beyond the second insulating portion 44 and surrounds a portion of the periphery of the nut storage recess 44h2 and a plate-like portion that extends from the first insulating portion 42 and the second insulating portion 44 toward the fixing base portion 34. The partition portions 47 suppress contact between the electrically conductive members 13b connected to the nut portions 60 and surrounding portions.

The shapes of the partition portions 46 and 47 are not limited to the above-described shapes and may have any other shapes. The partition portions 46 and 47 are not essential portions and need not be provided.

It is not essential that the insulating member 40 is a member molded with the heat sink 30 as an insert. The insulating member 40 may also be a member formed by molding separately from the heat sink 30 and then combining with the heat sink 30. The insulating member 40 may also be formed by a combination of a plurality of resin components. In this case, the plurality of resin components may be formed by a combination of a primary molded portion and a secondary molded portion molded with the primary molded portion as an insert. The primary molded portion may be a portion that is molded with the heat sink 30 as an insert or may be molded separately from the heat sink 30 and then combined with the heat sink 30.

Ribs

Configuration examples of the ribs 38 and 39 will be described more specifically.

The ribs 38 and 39 are located around the nut portions 50. The positions of the ribs 38 and 39 around the nut portions 50 are not limited in particular as long as the ribs 38 and 39 are formed at positions where the heat of the nut portions 50 is transferred to the ribs 38 and 39 via the portions of the insulating member 40 between the nut portions 50 and the ribs 38 and 39.

For example, in at least one of the nut portions 50, the ribs 38 and 39 may be provided at positions corresponding to all of the plurality of (in the present embodiment, four) sides 51 surrounding the nut portion 50. In the present embodiment, in all of the plurality of nut portions 50, the ribs 38 and 39 are provided at positions corresponding to all of the pluralities of sides 51 surrounding the nut portions 50.

The positions of the ribs 38 and 39 will be described in relation to the relationship with the plurality of (in the present embodiment, three) nut portions 50. In the present embodiment, it is assumed that the plurality of nut portions 50 are provided in parallel and spaced apart from each other, and the plurality of nut portions 50 provided in parallel form a nut group 50G. The ribs 38 are provided at the positions corresponding to all of the sides 51 located on the outer periphery of the nut group 50G, among the pluralities of sides 51 of the plurality of nut portions 50. Therefore, the ribs 38 can be arranged so as to be as long as possible on the outer periphery of the nut group 50G. Accordingly, the heat of the nut group 50G can be effectively transferred to the ribs 38.

In the nut group 50G, the ribs 39 are provided between the adjacent nut portions 50. One rib 39 is provided between the adjacent nut portions 50. Accordingly, the heat from the adjacent nut portions 50 is transferred to the one rib 39 between the adjacent nut portions 50. Between the adjacent nut portions 50, two ribs, one close to one of the adjacent nut portions 50 and the other close to the other of the adjacent nut portions 50, may also be provided.

The ribs 38 and 39 are each formed in an elongated plate-like shape that protrudes from one main surface of the first insulating portion 42. As viewed along the axial direction of the bolt B, the ribs 38 and 39 are formed so as to extend along the sides 51 of the nut portion 50. In other words, as viewed along the axial direction of the bolt B, the ribs 38 and 39 extend linearly while keeping an equal distance from the sides 51 of the nut portion 50.

Outward-facing side surfaces 51f corresponding to the sides 51 of the nut portions 50 are outward-facing surfaces orthogonal to the axial direction of the bolt B. The ribs 38 and 39 oppose the outward-facing side surfaces 51f with an interval therebetween. A space of equal width is formed between the outward-facing side surfaces 51f of the nut portion 50 and the side surfaces of the ribs 38 and 39 facing the nut portion 50.

The ribs 38 and 39 corresponding to the sides 51 are separated from each other. For example, the ribs 38 include a first adjacent rib 38a and a second adjacent rib 38b that are provided in correspondence with the sides 51 adjacent to each other at an angle (in the present embodiment, 90°) among the plurality of sides. FIG. 4 illustrates an example of the first adjacent rib 38a and the second adjacent rib 38b that are adjacent to each other as described above. A space S is formed between the first adjacent rib 38a and the second adjacent rib 38b. For example, in the case where the extension of the first adjacent rib 38a and the extension of the second adjacent rib 38b intersect each other at an angle, the space S is formed at a position corresponding to the intersection point.

Since the space S is present between the first adjacent rib 38a and the second adjacent rib 38b, it is easy to form the first adjacent rib 38a and the second adjacent rib 38b as compared with the case of contiguously forming the first adjacent rib 38a and the second adjacent rib 38b. For example, if the first adjacent rib 38a and the second adjacent rib 38b are connected at an angle, it is necessary to perform processing work such that the inward-facing surface of the first adjacent rib 38a and the inward-facing surface of the second adjacent rib 38b are connected to each other. Since it is difficult to form an inside corner where surfaces are connected at an angle by cutting or the like, it is conceivable that the surfaces are shaped so as to be connected via a curved surface. In that case, the ribs are brought closer to the nut portion 50 by the curved surface. It is assumed in this example that an appropriate insulation distance is provided between the ribs and the nut portion 50 for ensuring insulation. For this reason, the ribs are set at a position that is located farther away from the sides 51 as the ribs are brought closer to the nut portion 50 at the curved surface. This makes it less likely that the heat of the nut portion 50 will be transferred to the ribs.

Providing the space S between the first adjacent rib 38a and the second adjacent rib 38b eliminates the restriction in processing the portion where the first adjacent rib 38a and the second adjacent rib 38b are coupled. Accordingly, the first adjacent rib 38a and the second adjacent rib 38b can be arranged close to the sides 51 to the extent that the first adjacent rib 38a and the second adjacent rib 38b can be kept at a desired insulation distance. Accordingly, the heat can be effectively transferred from the nut portion 50 to the first adjacent rib 38a and the second adjacent rib 38b. In the present embodiment, the ribs 38 and 39 are provided in correspondence with the sides 51, and the space S is provided between all of the adjacent ribs 38 and 39. The adjacent ribs may be connected at an angle or via a curved portion.

The ribs 38 and 39 pass through the first insulating portion 42 covering the one main surface of the nut support base portion 32 and are embedded in the second insulating portion 44. The ribs 38 and 39 are not exposed in the nut storage recesses 44h1 and 44h2 and are not exposed on the side of the second insulating portion 44 opposite to the first insulating portion 42. That is, the insulating member 40 is interposed between the ribs 38 and 39 and the nut portion 50, and the ribs 38 and 39 and the nut portion 50 are electrically insulated from each other by the insulating member 40.

The protrusion height of the ribs 38 and 39 is less than or equal to the surface height of the nut portion 50, for example. More specifically, the protrusion height of the ribs 38 and 39 relative to the one main surface of the nut support base portion 32 is less than or equal to the height-wise position of the outer main surface of the nut portion 50 with reference to the one main surface of the nut support base portion 32. Accordingly, around the nut portion 50, the ribs 38 and 39 are less likely to protrude beyond the nut portion 50, and are less prone to interfere with fastening and fixing of the electrically conductive members 13 and 18 to the nut portion 50. The ribs 38 may have a height exceeding the nut portion 50 between the nut portions 50 or outside of the nut group 50G in the direction in which the nut portions 50 are arranged in parallel.

The protrusion height of the ribs 38 and 39 exceeds the position of the inner main surface of the nut portion 50 with respect to the one main surface of the nut support base portion 32, for example. In other words, in the axial direction of the bolt B, the ribs 38 and 39 and the nut portions 50 overlap. Accordingly, the heat of the nut portion 50 can be easily transferred to the ribs 38 and 39.

Advantageous Effects

According to the terminal block 20 configured as described above, the heat generated in the electrically conductive members 13 can be easily transferred from the nut portions 50 through the ribs 38 and 39 to the heat sink 30. This improves the heat dissipation of the terminal block 20.

In particular, in the mechanical and electrical integrated unit as described above, the first device 10 that is a mechanical device and the second device 15 that is an electrical device having a signal processing circuit are integrated and arranged close to each other. In this case, when the first device 10 and the second device 15 are connected via the electrically conductive members 13 and 18, for example, the electrically conductive members 13 and 18 are short and hardly exposed to the outside. Accordingly, there is a possibility that the heat generated in the first device 10 and the heat generated in the electrically conductive members 13 and 18 due to the flow of electricity will be easily transferred to the second device 15. In this case, the heat of the electrically conductive members 13 and 18, which can be heat transfer paths or heat generation sources, can be effectively transferred to the heat sink 30 by the terminal block 20. This makes it less likely that the heat will be transferred to the second device 15.

In order to reduce the amount of heat generation in the electrically conductive members 13 and 18, it is conceivable that the cross-sectional areas of the electrically conductive members 13 and 18 are increased. However, in the present embodiment, it is possible to transfer the heat of the electrically conductive members 13 and 18 to the heat sink 30 for cooling without having to increase the cross-sectional areas of the electrically conductive members 13 and 18.

Since the ribs 38 and 39 are provided at positions corresponding to all of the plurality of sides 51 surrounding the nut portion 50, the heat of the nut portion 50 can be effectively transferred to the heat sink 30.

The ribs 38 are provided at positions corresponding to all of the sides 51 that are located on the outer periphery of the nut group 50G, among the sides of the plurality of nut portions 50. In this respect as well, the heat of the nut portions 50 can be effectively transferred to the heat sink 30.

In this case, the heat of the nut portions 50 can be effectively transferred to the heat sink 30 also by the ribs 39 that are located between the plurality of nut portions 50.

The ribs 38 and 39 are formed so as to extend along the sides 51 of the nut portion 50. Accordingly, for example, the ribs 38 and 39 can be located as close to the nut portion 50 as possible while keeping a preferable insulation distance with respect to the nut portion 50. Accordingly, it is possible to effectively transfer the heat of the nut portion 50 to the heat sink 30 while maintaining the insulation performance.

Since the ribs 38 and 39 oppose at least one of the outward-facing side surfaces 51f of the nut portion 50 with an interval therebetween, the heat can be easily transferred from the outward-facing side surfaces 51f through the insulating member 40 to the opposing surfaces of the nut portion 50, and the heat of the nut portion 50 can be effectively transferred to the heat sink 30.

Since the space S is provided between the adjacent ribs 38 and 39, it is possible to eliminate the restrictions in the case of contiguously forming adjacent ribs, for example. Accordingly, it is easy to shape the ribs 38 and 39 so as to be as close to the nut portion 50 as possible while keeping an insulation distance between the ribs 38 and 39 and the nut portion 50.

Since the protrusion height of the ribs 38 and 39 is less than or equal to the surface height of the nut portion 50, the electrically conductive members 13 and 18 fastened and fixed to the nut portion 50 are less likely to interfere with the ribs 38 and 39.

In a configuration in which the nut portion 50 and the heat sink 30 are insulated from each other by the insulating member 40 and the nut portion 50 is held at a definite position and in a definite orientation (that is, in a state in which rotation is restricted), the ribs 38 and 39 are embedded in the second insulating portion 44. For this reason, the ribs 38 and 39 are arranged on the outer peripheral side of the nut portion 50, and the heat of the nut portion 50 can be easily transferred to the heat sink 30 through the ribs 38 and 39.

Modified Example

In the embodiment described above, the terminal block 20 is not necessarily required to connect the electrically conductive members 13 of the first device 10 and the electrically conductive members 18 of the second device 15 integrated with the first device 10. The terminal block 20 may connect electrically conductive members extending from a device at a location located away from the first device 10 and the electrically conductive members 13 of the first device 10.

The configurations described above in relation to the embodiment and modified example can be combined as appropriate as long as there is no contradiction therebetween.

The invention claimed is:

1. A terminal block that is to be fixed to a case of a device and to which an electrically conductive member is to be fastened by a bolt, the terminal block comprising:
   a nut to which the bolt is to be screwed;
   a heat sink that includes a heat dissipation portion configured to come into contact with a coolant for cooling the device; and
   an insulator that electrically insulates the nut and the heat sink from each other,
   wherein the heat sink includes a rib that protrudes from a surface of the insulator towards the nut, and the rib is located around the nut.

2. The terminal block according to claim 1, wherein:
   the nut is shaped so as to be surrounded by a plurality of sides as viewed along an axial direction of the bolt, and
   the rib is provided at positions corresponding to all of the plurality of sides.

3. The terminal block according to claim 1, wherein:
   the nut is shaped so as to be surrounded by a plurality of sides as viewed along an axial direction of the bolt,
   the nut is a plurality of nuts,
   the plurality of nuts are provided in parallel and spaced apart from each other to form a nut group, and
   the rib is provided at positions corresponding to all sides located on an outer periphery of the nut group, among the pluralities of sides of the plurality of nuts.

4. The terminal block according to claim 3, wherein the rib is provided at a position between the plurality of nuts.

5. The terminal block according to claim 2, wherein the rib is formed so as to extend along the sides of the nut.

6. The terminal block according to claim 2, wherein:
   the nut includes a plurality of outward-facing side surfaces corresponding to the plurality of sides, and
   the rib is provided so as to oppose at least one of the plurality of outward-facing side surfaces with an interval therebetween.

7. The terminal block according to claim 2, wherein:
   the rib includes a first adjacent rib and a second adjacent rib that are provided in correspondence with sides adjacent to each other at an angle among the plurality of sides, and
   a space is formed between the first adjacent rib and the second adjacent rib.

8. The terminal block according to claim 1, wherein a protrusion height of the rib is less than or equal to a surface height of the nut.

9. The terminal block according to claim 1, wherein:

the insulator includes a first insulator interposed between the nut and the heat sink and a second insulator surrounding a periphery of the nut, and the rib is embedded in the second insulator.

\* \* \* \* \*